(12) United States Patent
Zollo et al.

(10) Patent No.: US 7,286,366 B2
(45) Date of Patent: Oct. 23, 2007

(54) MULTILAYER CIRCUIT BOARD WITH EMBEDDED COMPONENTS AND METHOD OF MANUFACTURE

(75) Inventors: James A. Zollo, Weston, FL (US); John K. Arledge, Fort Lauderdale, FL (US); Nitin B. Desai, Coral Springs, FL (US)

(73) Assignee: Motorola, Inc., Schaumburg, IL (US)

( * ) Notice: Subject to any disclaimer, the term of this patent is extended or adjusted under 35 U.S.C. 154(b) by 300 days.

(21) Appl. No.: 11/089,065

(22) Filed: Mar. 24, 2005

(65) Prior Publication Data

US 2006/0215379 A1    Sep. 28, 2006

(51) Int. Cl.
*H05K 1/18* (2006.01)

(52) U.S. Cl. ............... 361/761; 361/765; 361/784; 174/260

(58) Field of Classification Search ........ 361/763–765, 361/782–784, 794–795; 174/259–262
See application file for complete search history.

(56) References Cited

U.S. PATENT DOCUMENTS

| | | | |
|---|---|---|---|
| 4,758,922 A | 7/1988 | Ishigaki et al. | |
| 5,418,690 A | 5/1995 | Conn et al. | |
| 5,708,569 A | 1/1998 | Howard et al. | |
| 5,834,994 A | 11/1998 | Shapiro | |
| 5,876,842 A * | 3/1999 | Duffy et al. | 428/209 |
| 6,218,729 B1 | 4/2001 | Zavrel et al. | |
| 6,443,179 B1 | 9/2002 | Benavides et al. | |
| 6,512,182 B2 * | 1/2003 | Takeuchi et al. | 174/256 |
| 6,577,208 B2 | 6/2003 | Kushitani et al. | |
| 6,750,737 B2 | 6/2004 | Uriu et al. | |
| 6,809,268 B2 * | 10/2004 | Hayashi et al. | 174/260 |

FOREIGN PATENT DOCUMENTS

| | | |
|---|---|---|
| JP | 10-215042 | 8/1998 |
| JP | 2002-223076 | 8/2002 |

OTHER PUBLICATIONS

Neasia Online, "Table 1", http://neasia.nikkeibp.com/nea/200305/manu_244638.html.
Neasia Online, "Figure 4", http://neasia.nikkeibp.com/nea/200305/manu_244638.html.

* cited by examiner

*Primary Examiner*—Tuan T Dinh

(57) ABSTRACT

A multilayer substrate assembly (80) includes at least one embedded component (52) within a plurality of stacked pre-processed substrates. Each pre-processed substrate can have a core dielectric (14), patterned conductive surfaces (12 and 16) on opposing sides of the core dielectric, and at least one hole (18) in each of at least two adjacently stacked pre-processed substrates such that at least two holes are substantially aligned on top of each other forming a single hole (19). The assembly further includes a processed adhesive layer (48) between top and bottom surfaces of respective pre-processed substrates. The embedded component is placed in the single hole and forms a gap (67 & 66) between the embedded component and a peripheral wall of the single hole. When the assembly is biased, the processed adhesive layer fills the gap to form the assembly having the embedded component cross-secting the plurality of preprocessed substrates.

7 Claims, 4 Drawing Sheets

10

20

30

40

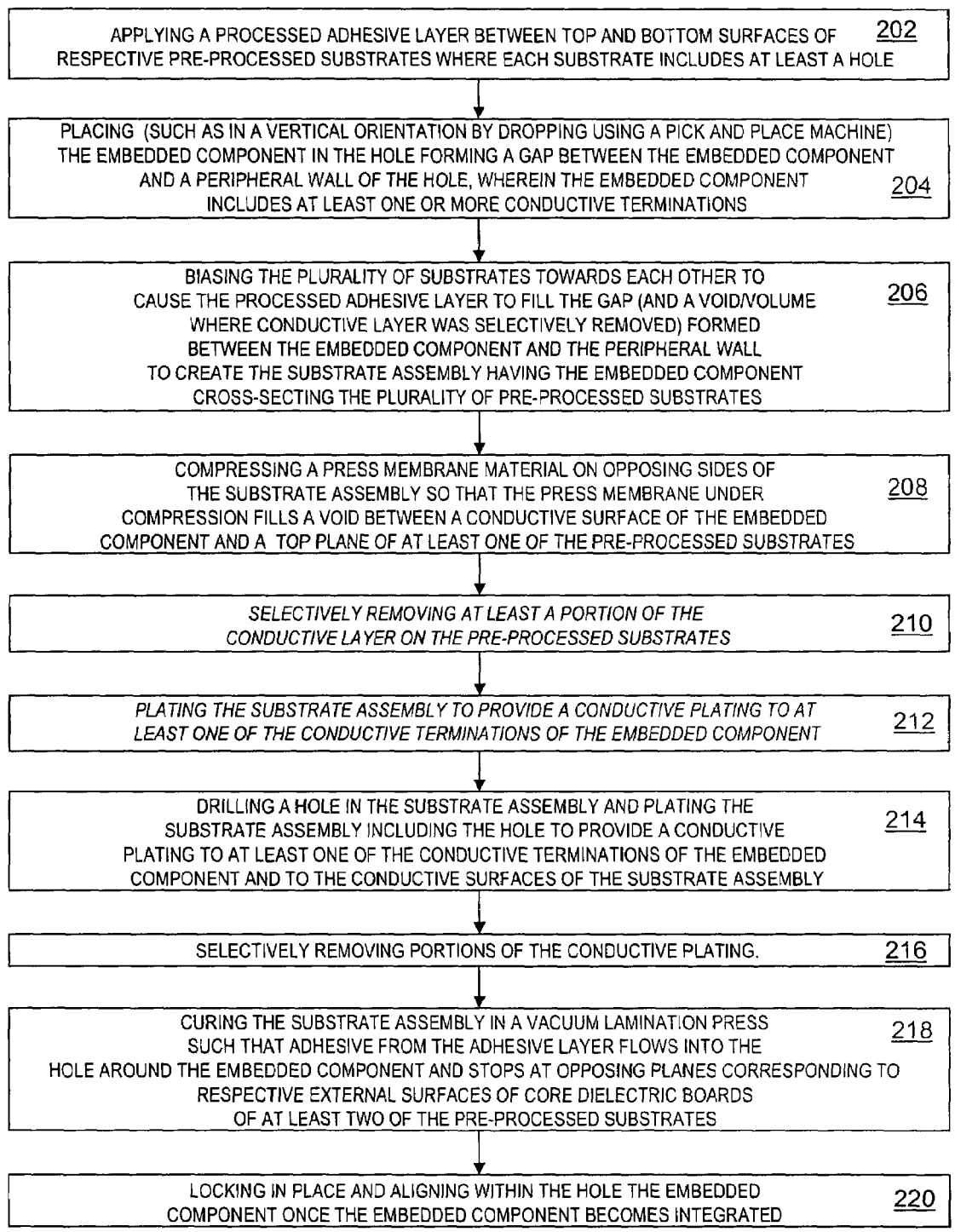

MULTILAYER CIRCUIT BOARD WITH EMBEDDED COMPONENTS AND METHOD OF MANUFACTURE

CROSS-REFERENCE TO RELATED APPLICATIONS

Not applicable

FIELD OF THE INVENTION

This invention relates generally to circuit boards, and more particularly to multilayer circuit boards having embedded components and the manufacture thereof.

BACKGROUND OF THE INVENTION

The increasingly widespread use of fine-pitch Ball-Grid Array (BGA), Chip Scale Packaging (CSP), and other evolving technology form-factors means that new fabrication techniques must be used to create printed circuit boards (PCBs) and architectures for placing components thereon. Additionally, efforts to reduce costs further compounds the problems associated with the smaller, denser, lighter, and faster systems that are evolving.

As integration continues to shrink the space required for mounting the active components in an electronic device, the routing density and the mounting density of the accompanying passive components becomes an increasingly problematic issue. Capacitors and resistors in chip component format can actually take up more space than the active circuit components, and cause great difficulty in circuit design. Many of these passive components are used as noise protection and grounding shunts on integrated circuit inputs and outputs. Ideally they should be located as close as possible to the actual IC pin connection. Since many IC's now come packaged in ball grid array format, it is impossible to locate a chip component directly adjacent to the lead it is supposed to connect.

One solution put forward is to integrate the passive components into the silicon on an integrated circuit. Since integration into the silicon is not often very practical, designers have sought to integrate the passives into the substrate. The most cost effective substrate is usually an organic printed circuit board. Integrating capacitors into these types of structures presents an obvious problem of size. The available space and layering only permits a small number of very low value capacitors to be integrated using the standard organic layer structure.

There are a couple of avenues being pursued for integrating resistors. The resistive foil layer (Ohmega-ply) and vacuum deposited resistor methods each present barriers of cost and infrastructure. Polymer thick film resistors are notoriously unreliable and variable, presenting a problem with achieving tight tolerances.

Some techniques for manufacturing a multilayered board with embedded components involve extra unnecessary steps by requiring removal of layers of dielectric material and/or conductive layers above conductive terminals of the embedded components to then subsequently provide external connections for the conductive terminals of the embedded components. Thus, a need exists for a reliable method and assembly for integrating components on a circuit board such as a multi-layer board that is suitable for the routing and mounting densities found today and in future circuit boards and that further avoids unnecessary process steps or structures.

SUMMARY OF THE INVENTION

Embodiments in accordance with the present invention enable a way to integrate components such as discrete resistor, inductor, and capacitor components or other suitable components into a PCB. In one aspect, embodiments can use existing surface mount chip components deployed in a novel manner in a Z-axis assembly. By burying the discrete components inside the substrate in a substantially vertical orientation, this technology allows a true Z-axis assembly of by-pass devices through the substrate. This approach facilitates a very clean self-shielding design, although the present invention is certainly not intended to be limited to such arrangements alone. The Z-axis orientation and the listed components are merely listed as exemplary structures and not intended to limit the scope of the invention.

Generally, embodiments in accordance with the present invention can include a component or components in a buried through hole on a multilayered circuit board, and encapsulation of the board including the components inside an applied dielectric layer.

In a first aspect in accordance with an embodiment of the present invention, a method of forming an embedded component in a multilayer substrate assembly can include the step of applying a processed adhesive layer between top and bottom surfaces of respective pre-processed substrates among a plurality of pre-processed substrates such that each of the pre-processed substrates include at least a hole. The method further includes the steps of placing the embedded component in the hole forming a gap between at least the embedded component and a peripheral wall of the hole, wherein the embedded component includes at least a conductive termination, and biasing the plurality of pre-processed substrates towards each other to cause the processed adhesive layer to fill the gap formed between the embedded component and the peripheral wall of the hole to create the substrate assembly having the embedded component cross-secting the plurality of pre-processed substrates. The pre-processed substrates can be biased by compressing a press membrane material on opposing sides of the substrate assembly so that the press membrane under compression fills a void between a conductive surface of the embedded component and a top plane of at least one of the pre-processed substrates. The method can further include the step of selectively removing at least a portion of the conductive layer on the pre-processed substrates. Note, the gap between at least the embedded component and the peripheral wall of the hole can further include at least a void corresponding to a volume where the conductive layer was selectively removed from the conductive layer residing between the conductive layer and the peripheral wall of the hole and the biasing step further causes the processed adhesive layer to fill the void. The method can further include the step of plating the substrate assembly to provide a conductive plating to at least one (of the) conductive termination(s) of the embedded component. Note, the conductive plating can be aligned directly above the at least one of the conductive terminations of the embedded component. The method can further include the step of drilling a via in the substrate assembly and plating the substrate assembly including the via to provide a conductive plating to at least one of the conductive terminations of the embedded component and to the conductive surfaces of the substrate assembly. The method can further include the step of selectively removing portions of the conductive plating.

The processed adhesive layer applied to the multilayer substrate assembly can include at least one among an epoxy resin coat, a thermosetting organic material layer, a PTFE layer, a thermoforming organic material layer, a fiberglass reinforced prepreg layer, and a thermo plastic dielectric layer over at least an intermediary pre-processed substrate among the plurality of pre-processed substrates. Of course, other materials used for circuit boards are certainly contemplated herein. The substrate assembly can be cured in a vacuum lamination press such that adhesive from the adhesive layer flows into the hole around the embedded component and stops at opposing planes corresponding to respective external surfaces of core dielectric boards of at least two of the pre-processed substrates among the plurality of pre-processed substrates. Note, the embedded component can be placed in a vertical orientation within the hole having at least one conductive terminal exposed among a top and a bottom outside surface of the substrate assembly. In one embodiment the embedded component can be placed in the hole by dropping the embedded component into the hole using a pick and place machine and the method can further include the step of inspecting the hole for the presence of the embedded component. Also note that once the embedded component becomes integrated in the substrate assembly, it remains locked in place and aligned within the hole.

In a second aspect in accordance with an embodiment of the present invention a multilayer substrate assembly having at least one embedded component in a hole among a plurality of substrate cores can include a plurality of pre-processed substrates stacked upon each other. Each pre-processed substrate can have a core dielectric, patterned conductive surfaces on opposing sides of the core dielectric, and at least one hole in each of at least two adjacently stacked pre-processed substrates among the plurality of pre-processed substrates such that at least two holes are substantially aligned on top of each other forming a single hole. The assembly further comprises a processed adhesive layer between top and bottom surfaces of respective pre-processed substrates among the plurality of pre-processed substrates and an embedded component having at least one conductive termination placed in the single hole forming a gap between at least the embedded component and a peripheral wall of the single hole. Note, the processed adhesive layer fills the gap formed between the embedded component and the peripheral wall of the single hole to create the multilayer substrate assembly having the embedded component cross-secting the plurality of pre-processed substrates. The multilayer substrate assembly can further include conductive plating directly placed on at least one (among the) conductive termination(s) of the embedded component. The conductive plating can also be placed within a through hole forming interconnections between conductive surfaces of at least two of the plurality of pre-processed substrates. The conductive plating can also be selectively removed using any number of known techniques such as etching or drilling. The patterned conductive surfaces can be formed from copper and the processed adhesive layer can be formed from materials selected from the group comprising epoxy resin, epoxies, thermosetting organic materials, PTFEs, thermoforming organic materials, liquid dielectrics, glass reinforced prepregs, thermo plastic dielectrics, and paste dielectrics. Further note that the embedded component can be a component selected from the group including a capacitor, a resistor, an inductor, or any combination thereof.

In a third aspect of the present invention, a multilayer substrate assembly having at least one embedded component can include a processed adhesive layer, a plurality of pre-processed substrates stacked upon each other where each pre-processed substrate is separated from another by the processed adhesive layer. Each pre-processed substrate can have a patterned top conductive layer on a top surface and a patterned bottom conductive layer on a bottom surface of a dielectric core of each pre-processed substrate. The assembly further comprises a hole within each pre-processed substrate and within the processed adhesive layer such that a single substantially aligned hole is formed upon stacking and aligning the plurality of pre-processed substrates and the processed adhesive layer and an embedded component having at least two conductive terminations placed in the single substantially aligned hole forming a gap between at least the embedded component and a peripheral wall of the single hole. The processed adhesive layer is arranged to fill the gap formed between the embedded component and the peripheral wall of the single substantially aligned hole when the plurality of pre-processed substrates are compressed towards each other to form the multilayer substrate assembly.

BRIEF DESCRIPTION OF THE DRAWINGS

FIG. 11 is a flow chart illustrating a method of forming an embedded component in a multilayer substrate assembly in accordance with an embodiment of the present invention.

DETAILED DESCRIPTION OF THE DRAWINGS

Generally, embodiments in accordance with the present invention take a different approach to integrating components in a multilayer board. In several embodiments, a substrate assembly and method of making same takes advantage of the most common methods of fabricating High Density Interconnect (HDI) structures and printed circuit boards. Before describing the process of manufacture in detail, a brief description of the components in the structure as shown in FIGS. 1-4 will facilitate the description of the process of manufacture.

Figure 1:
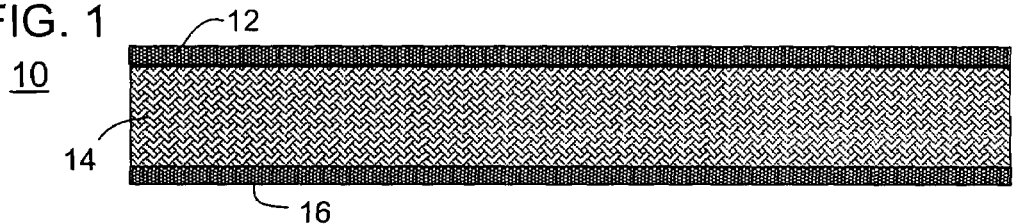
FIG. 1 is side cut view of a pre-processed substrate having conductive layers on opposing sides of a core dielectric board in accordance with an embodiment of the present invention.
Figure 2:
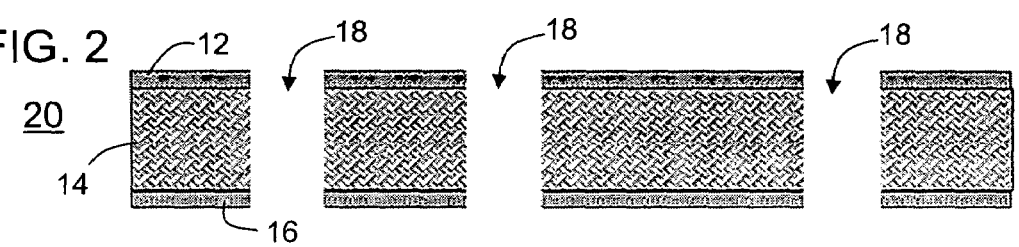
FIG. 2 is a side cut view of the pre-processed substrate of FIG. 1 further including at least one hole in accordance with an embodiment of the present invention.
Figure 3:
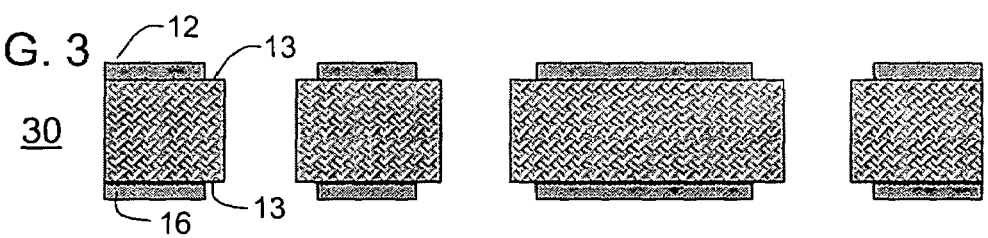
FIG. 3 is a cut side view of the pre-processed substrate of FIG. 2 further having portions of the conductive layers selectively removed (or a patterned conductive layer) as used in a multilayer substrate assembly in accordance with an embodiment of the present invention.

A pre-processed substrate or board 10 as illustrated in FIG. 1 can include a dielectric core 14 having conductive layers or metallization 12 and 16 on both top and bottom surfaces respectively of the dielectric core 14. As shown in FIG. 2, a pre-processed substrate 20 can then further include a plurality of holes 18 formed in the pre-processed substrate 20. The holes can be drilled holes or holes made in any other manner. A pre-processed board 30 in a subsequent step can then have portions 13 of the conductive layers 12 and 16 removed. The pre-processed board 30 (in FIG. 3) represents a pre-processed board as used in a multilayer substrate assembly. Note, however, the method of manufacturing this pre-processed board is certainly not limited to the method described herein since equivalent structures of the pre-processed board 30 can be constructed in numerous ways.

Figure 4:
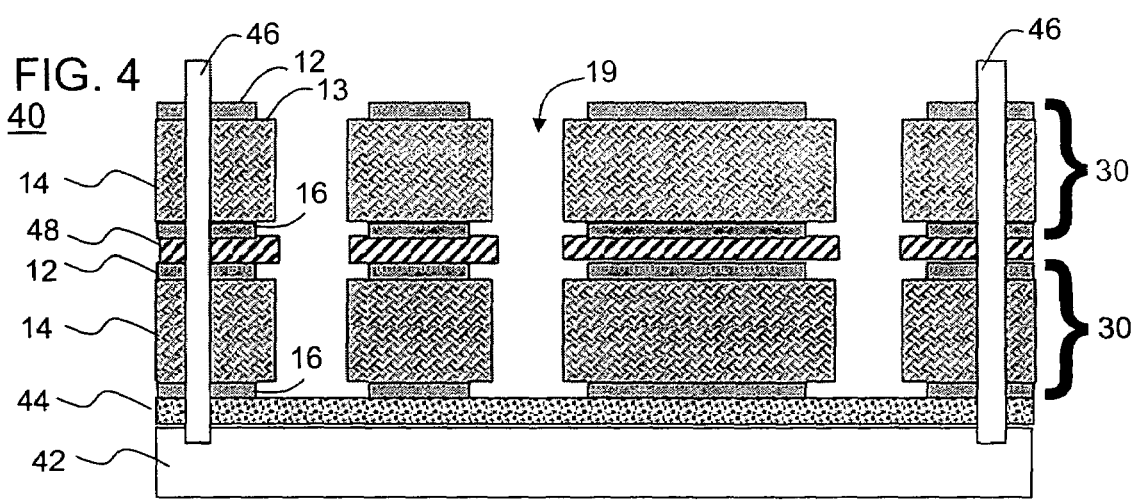
FIG. 4 is a cut side view of a plurality of stacked and aligned pre-processed substrates in accordance with an embodiment of the present invention.

A side cut view of a portion of a substrate assembly 40 in a tooling having a pin alignment system is shown in FIG. 4 including a first or bottom carrier 42, a press membrane material 44 and pins 46 that serve to stack and align a stack of pre-processed substrates 30 on top of each other. In-between at least one pair of adjacently stacked pre-processed substrates (30) is an adhesive layer 48 such as a processed prepreg dielectric. The adhesive layer 48 can be processed by having holes corresponding to the holes 18 in the pre-processed substrates 30. Once stacked and aligned, the holes 18 of each of the pre-processed substrates 18 and the hole in the adhesive can form a single aligned hole 19. The first or bottom carrier 42 and a second or top carrier 62 (as shown in FIG. 6) can serve as a press in a lamination process as will be discussed further below.

It should be understood within contemplation of the present invention that the pre-processed substrate 30 can also be a bare substrate with a conductive layer on at least on one side and with or without any conductive patterns on either side or conductive patterns on just one side of the core dielectric board 14.

Figure 5:
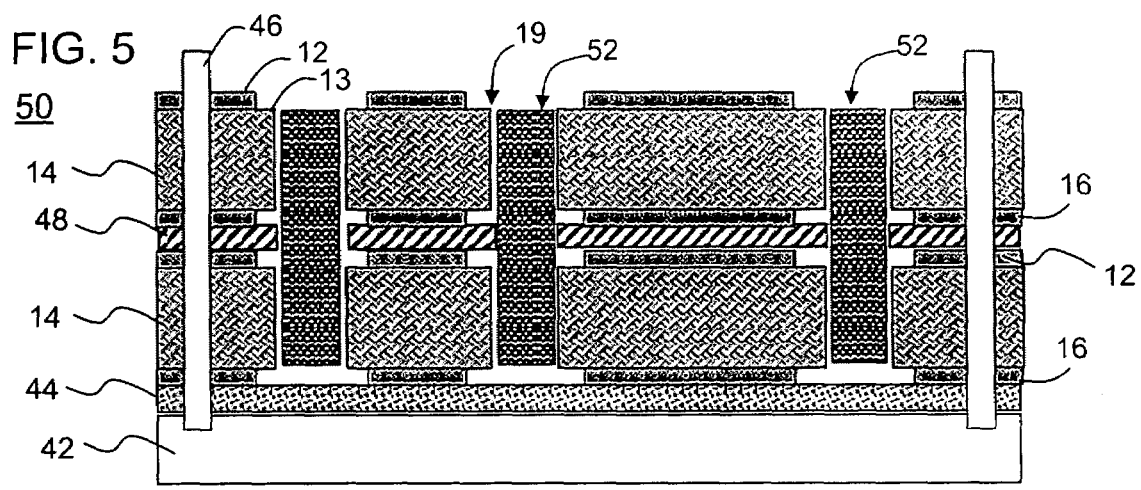
FIG. 5 is a cut view of a portion of the substrate assembly of FIG. 4, further including an embedded component in accordance with an embodiment of the present invention.

Referring to the multilayer substrate assembly 50 of FIG. 5, a component or components 52 can be placed within the single aligned hole or holes 19 while the assembly remains in the tooling. Although a single component is shown in a Z-axis orientation, it should be understood that multiple components can be placed in the hole 19 and other orientations can be used as long as a conductive surface of the component remains exposed as will become more apparent with reference to the description of FIGS. 6-9.

Figure 6:
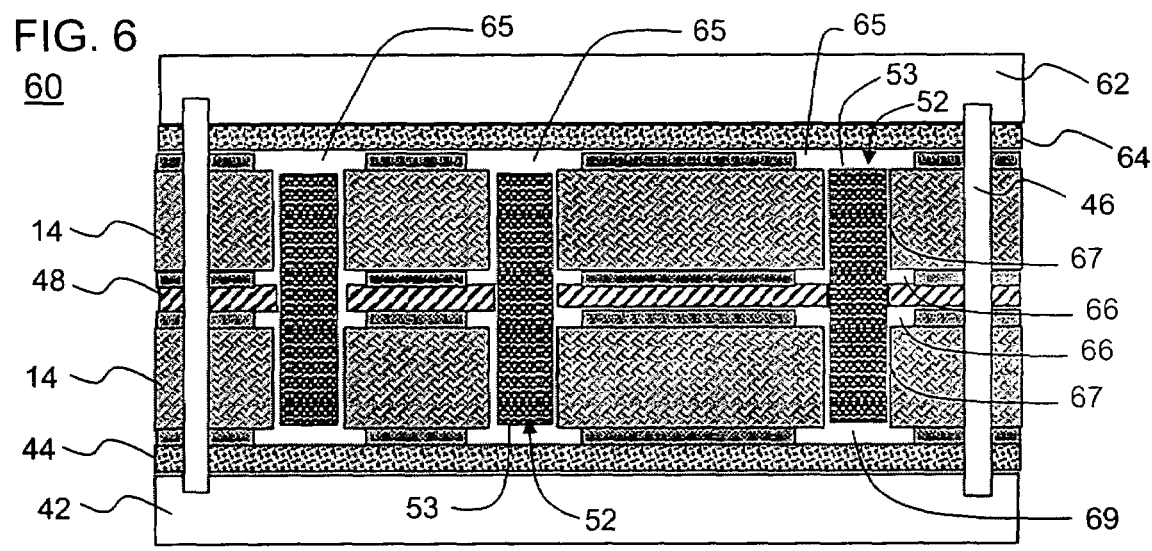
FIG. 6 is a cut view of the portion of the substrate assembly of FIG. 5 shown within a tooling having a press membrane material and shown before a compression force is applied to the top and bottom surfaces of the plurality of pre-processed substrates in accordance with an embodiment of the invention.
Figure 7:
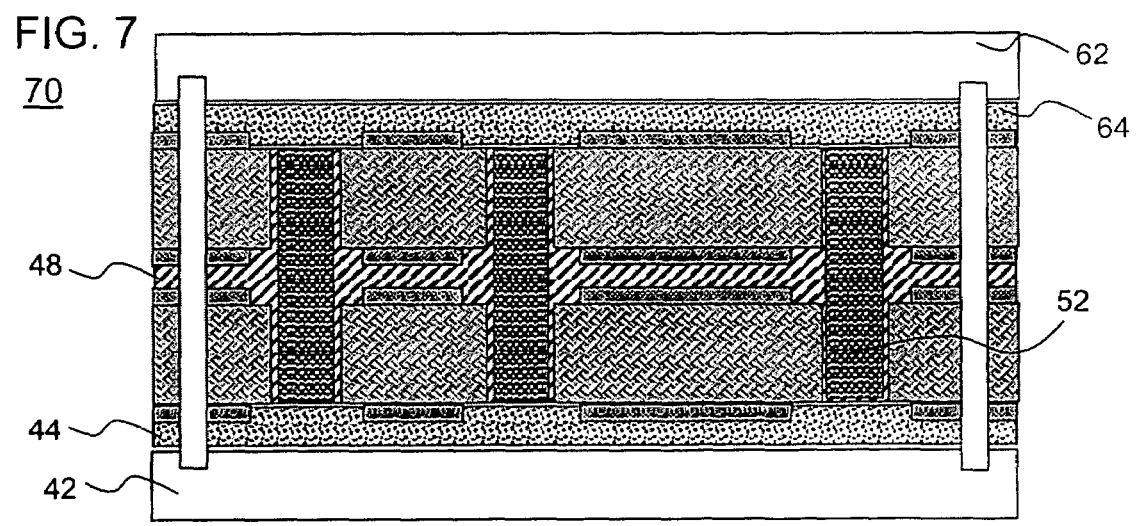
FIG. 7 is a cut view of the portion of the substrate assembly of FIG. 6 after a compression force is applied in accordance with an embodiment of the present invention.

In FIG. 6, the multilayer substrate assembly of FIG. 5 now further includes the second or top carrier 62 having a press membrane 64. The press membranes 44 and 64 can be made of a compressible material such a compressible Teflon. Note, by placing the embedded component 52 in the hole 19, a gap 67 is formed between at least the embedded component 52 and a peripheral wall of the hole 19. Note, the gap 67 between at least the embedded component and the peripheral wall of the hole can further include at least a void or another gap 66 corresponding to a volume where the conductive layer was selectively removed from the conductive layer (13) residing between the conductive layer (12 and/or 16) and the peripheral wall of the hole 19. Also note that press membranes 44 and 64 create a void 65 and 69 between a conductive surface 53 of the embedded component 52 and a top plane (or a bottom plane) of at least one of the pre-processed substrates. Thus, as shown in FIG. 7, when the top and bottom carriers 62 and 42 are biased or compressed towards each other using known industry standard lamination processes, this compression causes the press membrane 44 and 64 to fill the voids 65 and 69. During the lamination process, heat will then be added to process adhesive layer 48 to fill the gaps 67 and 66, but not the voids 65 and 69 since the press membranes 64 and 44 have temporarily filled the voids 65 and 69 respectively during the compression. In other words, the carriers 62 and 42 bias the plurality of pre-processed substrates 30 towards each other to cause the processed adhesive layer 48 to fill the gap (or gaps) 67 (and 66) formed between the embedded component and the peripheral wall of the hole 19 to create the substrate assembly having the embedded component 52 cross-secting the plurality of pre-processed substrates 30. The pre-processed substrates 30 can be biased by compressing a press membrane material (44 and 64) on opposing sides of the substrate assembly so that the press membrane under compression fills the voids 65 and 69.

Figure 8:
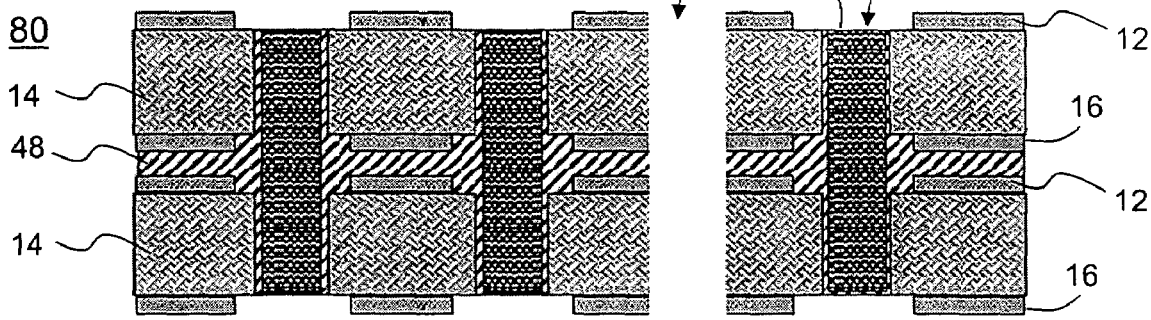
FIG. 8 is a cut view of the portion of the substrate assembly of FIG. 7 removed from the tooling and further having at least one through hole drilled in accordance with an embodiment of the present invention.
Figure 9:
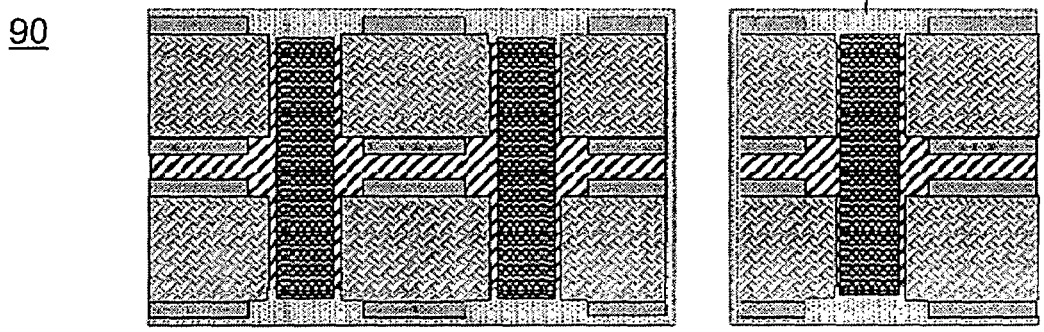
FIG. 9 is a cut view of the portion of the substrate assembly of FIG. 8, further illustrating a plating step in accordance with an embodiment of the present invention.
Figure 10:
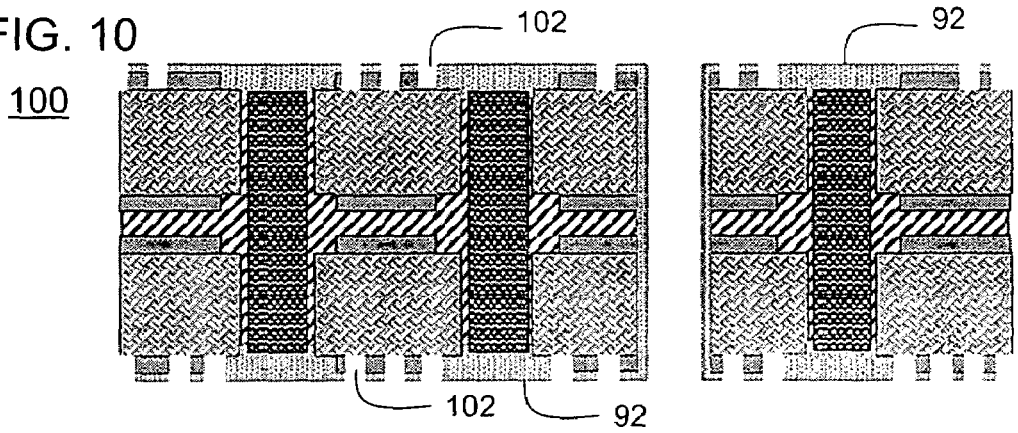
FIG. 10 is a cut view of the portion of the substrate assembly of FIG. 9, further illustrating an etching (or patterning) step applied to the plating and/or conductive layers of the pre-processed substrates in accordance with an embodiment of the present invention.

Referring to FIG. 8, a multilayer substrate assembly 80 is shown after compression and removal from the tooling. Additionally, the assembly 80 includes a through-hole via 82 which can be made by drilling or other means. Further note that after removal of the press membranes of the tooling that the conductive surface(s) 53 of the components 52 are conveniently exposed for further processing and interconnections. As illustrated in FIG. 9, the assembly 80 can then be further conductively plated with plating 92 as shown in the multilayer substrate assembly 90. The plating 92 includes the plating of the through-hole via 82 which further provides interconnections between the conductive layers (12 and 16) of the respective pre-processed substrates 30. Note, the plating 92 further provides an aligned Z-axis contact point directly above the conductive terminal 53 of the component 52 without any further conductive plating. In FIG. 10, the assembly 90 can then have portions of the plating 92 and/or portions of the conductive layers 12 or 16 selectively removed using any number of techniques such as imaging and etching.

Essentially, in most embodiments as shown, a series of holes or holes 19 can be formed in an optimal position as close to IC pins as possible. With this structure, it would typically mean a hole directly under the solder pad for the IC pin. A chip component (52) with up to a length substantially equal to the thickness of the stacked pre-processed substrates can then be disposed into the hole 19. Finally the outer surface would be plated and imaged/etched and the circuit would be completed. Of course, additional layers of pre-processed substrates can be used to create multilayer boards with any number of layers. It should be understood that the present invention is not limited thereto, and that other adhesive layers can be used such as epoxy resin coats, epoxies and other thermosetting organic materials, and PTFE and other thermoforming organic materials, fiberglass reinforced prepreg layers, thermo plastic dielectric layers, paste dielectrics, and liquid dielectrics. The conductive layers are typically copper, but numerous other conductors can be used within contemplation of the present invention.

It is obvious to anyone skilled in the art that variations of this process are possible, but any process mounting chip components (or other components) vertically (or in other orientations) in a buried through hole inside an HDI structure, and then using HDI vias to make contact to the ends of the buried chip components would be contemplated by the embodiments disclosed herein. Variations include, but are not limited to, the use of photovias or plasma vias instead of lasers, or the use of liquid or paste dielectrics instead of resin coated foil, or the use of any integrated circuit or other component having at least two conductive terminations for embedded components rather than just chip components. For example, embodiments are contemplated for small, compact modules such as voltage controlled oscillators, RF front end circuits, and power amplifiers to mention a few. As more complex circuits or devices become smaller, the more likely such devices can serve as the embedded component herein. Adding additional layers or other levels of embedded components, as with sequential lamination techniques, would also be contemplated.

Referring to FIG. 11, a method 200 of forming an embedded component in a multilayer substrate assembly is shown. The method 200 can include the step 202 of applying a processed adhesive layer between top and bottom surfaces of respective pre-processed substrates among a plurality of pre-processed substrates such that each of the pre-processed substrates include at least a hole. The method 200 can further include the step 204 of placing the embedded component in the hole (such as in a vertical orientation) forming a gap between at least the embedded component and a peripheral wall of the hole, wherein the embedded component includes at least two conductive terminations. The embedded component can be placed in the hole using a pick and place machine for example. Note, the gap between at least the embedded component and the peripheral wall of the hole can further include at least a void corresponding to a volume where portions of a conductive layer were selectively removed from the conductive layer residing between the conductive layer and the peripheral wall of the hole. The method 200 can also include the step 206 of biasing the plurality of pre-processed substrates towards each other to cause the processed adhesive layer to fill the gap (and the void corresponding to the volume where the conductive layer was selectively removed) formed between the embedded component and the peripheral wall of the hole to create the substrate assembly having the embedded component cross-secting the plurality of pre-processed substrates. The step of biasing can include the step 208 of compressing a press membrane material on opposing sides of the substrate assembly so that the press membrane under compression fills a void between a conductive surface of the embedded component and a top plane of at least one of the pre-processed substrates.

The method 200 can also include the step 210 of selectively removing at least a portion of the conductive layer on the pre-processed substrates and the step 212 of plating the substrate assembly to provide a conductive plating to at least one of the conductive terminations of the embedded component. Optionally, the method 200 can further include the step 214 of drilling a via in the substrate assembly and plating the substrate assembly including the via to provide a conductive plating to at least one of the conductive terminations of the embedded component and to the conductive surfaces of the substrate assembly and then (optionally) selectively removing portions of the conductive plating at step 216. At step 218, the substrate assembly can be cured (or heated) in a vacuum lamination press such that adhesive from the adhesive layer flows into the hole around the embedded component and stops at opposing planes corresponding to respective external surfaces of core dielectric boards of at least two of the pre-processed substrates among the plurality of pre-processed substrates. In this manner, the embedded component locks in place and aligns within the hole at step 220 once the embedded component becomes integrated in the substrate assembly.

Embodiments in accordance with the present invention could also be used to fabricate any PCB, but might be especially applicable to fine line high density interconnect designs. The most immediate benefit lies in application to bypass devices on high pin count integrated circuit packages.

Additionally, the description above is intended by way of example only and is not intended to limit the present invention in any way, except as set forth in the following claims.

What is claimed is:

1. A multilayer substrate assembly having at least one embedded component in a hole among a plurality of substrate cores, comprising:

a plurality of pre-processed substrates stacked upon each other, each pre-processed substrate having a core dielectric, patterned conductive surfaces on opposing sides of the core dielectric, and at least one hole in each of at least two adjacently stacked pre-processed substrates among the plurality of pre-processed substrates such that at least two holes are substantially aligned on top of each other forming a single hole;

a processed adhesive layer between top and bottom surfaces of respective pre-processed substrates among the plurality of pre-processed substrates; and an embedded component having at least one conductive termination placed in the single hole forming a gap between at least the embedded component and a peripheral wall of the single hole, wherein the processed adhesive layer fills the gap formed between the embedded component and the peripheral wall of the single hole to create the multilayer substrate assembly having the embedded component cross-secting the plurality of pre-processed substrates.

2. The multilayer substrate assembly of claim 1, wherein the assembly further comprises conductive plating directly placed on at least one among the conductive terminations of the embedded component.

3. The multilayer substrate assembly of claim 1, wherein the patterned conductive surfaces are formed from copper and the processed adhesive layer are formed from materials selected from the group comprising epoxy resin, epoxies, thermosetting organic materials, PTFEs, thermoforming organic materials, liquid dielectrics, glass reinforced prepregs, thermo plastic dielectrics, and paste dielectrics.

4. The substrate assembly of claim 1, wherein the embedded component is a component selected from the group comprising a capacitor, a resistor, an inductor, and any combination thereof.

5. The multilayer substrate assembly of claim 2, wherein the conductive plating further comprises conductive plating placed within a through hole forming interconnections between conductive surfaces of at least two of the plurality of pre-processed substrates.

6. The multilayer substrate assembly of claim 2, wherein portions of the conductive plating are selectively removed.

7. A multilayer substrate assembly having at least one embedded component, comprising:

a processed adhesive layer;

a plurality of pre-processed substrates stacked upon each other, each pre-processed substrate being separated from another by the processed adhesive layer, each pre-processed substrate having a patterned top conductive layer on a top surface and a patterned bottom conductive layer on a bottom surface of a dielectric core of each pre-processed substrate;

a hole within each pre-processed substrate and within the processed adhesive layer, wherein a single substantially aligned hole is formed upon stacking and aligning the plurality of pre-processed substrates and the processed adhesive layer; and an embedded component having at least two conductive terminations placed in the single substantially aligned hole forming a gap between at least the embedded component and a peripheral wall of the single hole, wherein the processed adhesive layer is arranged to fill the gap formed between the embedded component and the peripheral wall of the single substantially aligned hole when the plurality of pre-processed substrates are compressed towards each other to form the multilayer substrate assembly.

* * * * *